United States Patent [19]
McEwan

[11] Patent Number: 6,060,915
[45] Date of Patent: May 9, 2000

[54] CHARGE TRANSFER WIDEBAND SAMPLE-HOLD CIRCUIT

[76] Inventor: Thomas E. McEwan, 1734 Cairo St., Livermore, Calif. 94550

[21] Appl. No.: 09/080,502

[22] Filed: May 18, 1998

[51] Int. Cl.[7] .................................................... G11C 27/02
[52] U.S. Cl. .............................................................. 327/94
[58] Field of Search ................................ 327/91, 92, 93, 327/94, 96, 97; 341/122

[56] References Cited

U.S. PATENT DOCUMENTS

| | | | |
|---|---|---|---|
| 3,175,214 | 3/1965 | Ramsay et al. | 343/13 |
| 3,195,130 | 7/1965 | Adrian | 343/12 |
| 3,423,754 | 1/1969 | Gunn | 343/17.1 |
| 3,631,351 | 12/1971 | Paine et al. | 328/133 |
| 3,680,100 | 7/1972 | Woerrlein | 343/11 R |
| 3,806,795 | 4/1974 | Morey | 324/6 |
| 4,008,469 | 2/1977 | Chapman | 343/5 NA |
| 4,241,346 | 12/1980 | Watson | 343/7 A |
| 4,414,549 | 11/1983 | Wichmann | 343/18 E |
| 4,430,653 | 2/1984 | Coon et al. | 343/5 NA |
| 4,443,799 | 4/1984 | Rubin | 343/17.2 PC |
| 4,497,252 | 2/1985 | Taylor | 102/214 |
| 4,596,023 | 6/1986 | Driver et al. | 375/55 |
| 4,641,317 | 2/1987 | Fullerton | 375/1 |
| 4,743,906 | 5/1988 | Fullerton | 342/27 |
| 4,905,008 | 2/1990 | Kawano et al. | 342/22 |
| 4,965,467 | 10/1990 | Bilterijst | 307/352 |
| 4,975,703 | 12/1990 | Delisle et al. | 342/21 |
| 4,979,186 | 12/1990 | Fullerton | 375/23 |
| 5,020,374 | 6/1991 | Petroff et al. | 73/861.25 |
| 5,084,706 | 1/1992 | Ross et al. | 342/368 |
| 5,225,776 | 7/1993 | Dobos et al. | 324/121 R |
| 5,226,328 | 7/1993 | Petroff et al. | 73/861.25 |
| 5,333,508 | 8/1994 | Petroff et al. | 73/861.25 |

(List continued on next page.)

FOREIGN PATENT DOCUMENTS

WO91/13370  5/1991  WIPO .

OTHER PUBLICATIONS

Scott, William B., "UWB Technologies Show Potential For High–Speed, Covert Communications", [*Aviation Week & Space Technology*], 40,44, (Jun. 4, 1990).

Scott, William B., "Defense Dept. Panel of Radar Experts To Study Ultra–Wideband Technologies", [*Aviation Week & Space Technology*], 55, (Mar. 26, 1990).

Bennett, Leonard C. et al., "Time–Domain Electromagnetics and Its Applications" [*Proceedings of the IEEE*], 66, 3, 299–316 (Mar. 3, 1978).

Anderson, Forrest et al., "Wideband Beam Patterns From Sparse Arrays" [*Proceedings of the First Los Alamos Symposium*], 273–286.

Bretthorst, G. Larry, "Radar Target Discrimination Using Probability Theory" [*Proceedings of the First Los Alamos Symposium*], 417–434.

"Pulse and Waveform Generation with Step Recovery Diodes", Hewlett Packard Application Note 918, Hewlett–Packard, Jun. 1986, pp. 1–22.

*Primary Examiner*—My-Trang Nu Ton
*Attorney, Agent, or Firm*—Haynes & Beffel LLP

[57] ABSTRACT

A wideband sample-hold circuit is formed with a single diode in a minimum component configuration. A gate circuit comprised of a first capacitor and an impedance element forms a gate pulse, stores the sampled signal charge on the first capacitor, and transfers the charge to a second capacitor via the impedance element. The impedance element also defines the gate pulse width, in combination with the first capacitor. In a preferred mode, the first capacitor is responsive to individual gate pulses while the larger second capacitor integrates charge packets from the first capacitor due to multiple gate pulses to provide an integrated baseband output. In radar rangefinder applications, the baseband output is an equivalent time replica of the RF input. The sample-hold circuit has other applications in radar motion sensing and time domain reflectomitry.

31 Claims, 3 Drawing Sheets

U.S. PATENT DOCUMENTS

| | | | |
|---|---|---|---|
| 5,345,471 | 9/1994 | McEwan | 375/1 |
| 5,352,994 | 10/1994 | Black et al. | 33/33 |
| 5,353,303 | 10/1994 | Walthall | 375/1 |
| 5,363,108 | 11/1994 | Fullerton | 342/27 |
| 5,420,589 | 5/1995 | Wells et al. | 342/22 |
| 5,455,593 | 10/1995 | Ross | 342/375 |
| 5,463,656 | 10/1995 | Polivka et al. | 375/200 |
| 5,479,120 | 12/1995 | McEwan | 327/91 |
| 5,519,342 | 5/1996 | McEwan | 327/94 |
| 5,573,012 | 11/1996 | McEwan | 128/782 |
| 5,586,145 | 12/1996 | Morgan et al. | 375/239 |
| 5,610,907 | 3/1997 | Barrett | 370/342 |
| 5,627,995 | 5/1997 | Miller et al. | 395/497.02 |
| 5,687,169 | 11/1997 | Fullerton | 370/324 |

CHARGE TRANSFER WIDEBAND SAMPLE-HOLD CIRCUIT

BACKGROUND OF THE INVENTION

1. Field of the Invention

The present invention relates to electronic samplers, and more particularly to high speed diode samplers for wideband radar receivers utilizing equivalent time sampling and other applications.

2. Description of Related Art

High range resolution systems such as wideband radar, time domain reflectometers, and recently developed radio location systems as described in U.S. Pat. No. 5,589,838 by McEwan often employ sampling type receivers. Typically, sampling receivers repetitively sample the incoming signal with sample timing that incrementally increases in delay up to a maximum and then begins over again at a minimum delay point. When the timing delay is slowly incremented relative to the RF pulse rate, the sampler output is a time-expanded replica of the RF waveform, appearing on a much slower time scale called equivalent time. Equivalent time systems are attractive from a standpoint of cost and performance, since wide bandwidth signals can be accurately processed at much lower bandwidths, usually in the audio frequency range.

Prior art samplers often use a 4-diode bridge structure where the bridge serves as a series gate between the RF input and the charge-holding capacitor. This structure and its deficiencies are discussed in U.S. Pat. No. 5,345,471 by McEwan. Generally, the 4-diode structure requires complementary gate pulses, requiring a broadband balun, and some of the signal is shunted away during sampling. Similar deficiencies exist in most 2-diode samplers.

McEwan, in U.S. Pat. Nos. 5,345,471 and 5,523,760 discloses integrating wideband samplers. These samplers require an impulse type gate function at the drive node of the sampling diodes. This is a general limitation since most impulse functions are derived from a step-like waveform produced by a fast switch. Preferably, the sampler can be driven directly by a step function.

Another limitation to virtually all prior art wideband samplers is the need to drive a relatively low impedance in the gating path, such as 50 Ω. It would be far better if the gate pulse generator could drive a very high impedance, or equivalently, a very small capacitance. A lightly loaded fast switch can switch rapidly even with substantial parasitic inductance in its path. Fast gate pulse transitions lead directly to wider sampling bandwidths.

SUMMARY OF THE INVENTION

A primary object of the present invention is to provide a wideband sampler with a very low gate drive requirement. This is accomplished by eliminating the usual low impedance pulse forming network (PFN) in the gating path and merging its function with a very small charge-holding capacitor in the sampler. The sampler then operates directly on a step function gate pulse without the need for an impulse generator.

A further object of the present invention is to provide a sampler with very high RF bandwidth. Relative to prior art samplers, low drive requirement leads directly to an improvement in bandwidth. The single diode sampler described in U.S. Pat. No. 5,523,760 by McEwan exhibits about 5 GHz bandwidth with a 100 ps wide gate impulse. The present invention exhibits nearly 8 GHz bandwidth from the step function gate pulse source.

Another object of the present invention is to provide an implementation with a minimum of components to facilitate a wideband layout with a minimum of parasitics. Since the sampler is comprised of two capacitors, one diode and one impedance element, it is a model of simplicity.

Another object of the present invention is to provide a sampling type receiver for the unlicensed microwave bands, such as the 5.8 GHz ISM band, using a sampler that operates with a high voltage transfer efficiency and a low noise figure.

Another object of the invention is to provide a low cost receiver for pulsed RF radar rangefinders. There is wide commercial interest in accurate radar rangefinders for automotive applications, liquid level sensing, robotics, etc., which could benefit from high resolution equivalent time radars using low-cost high-performance sampling type receivers.

The present invention may also be used to increase the bandwidth and performance of motion sensors such as the Micropower Impulse Radar (MIR) motion sensor described in U.S. Pat. No. 5,361,070 by McEwan.

The invention is a simplified wideband sample-hold circuit formed with a single sampling diode. The sampler employs a first capacitor and an impedance element as a gate circuit connected to the sampling diode. The gate circuit produces a gating pulse which turns the sampling diode on to sample an RF input signal. The sampled signal is transferred to a second capacitor which integrates samples and produces a sampled output.

Uses for the present invention include security alarms, home automation and lighting control, industrial and robotic controls, automatic toilet and faucet control, automatic door openers, vehicle backup warning and collision detection, and general appliance control.

In another embodiment of the present invention, a time domain reflectometer where an impulse is propagated along a conductor or guidewire can be realized for use in a variety of applications, such as an "electronic dipstick" for fluid level sensing.

The present invention places a minimal load on the RF input when not sampling: the capacitance of the sampling diode, which may be less than 0.1 pF. Minimal loading is extremely important in time domain reflectometer applications where an accurate 50 Ω source termination is needed to reduce triple transit reflections.

DETAILED DESCRIPTION OF THE PREFERRED EMBODIMENT

A detailed description of the present invention is provided below with reference to the figures.

Figure 1:
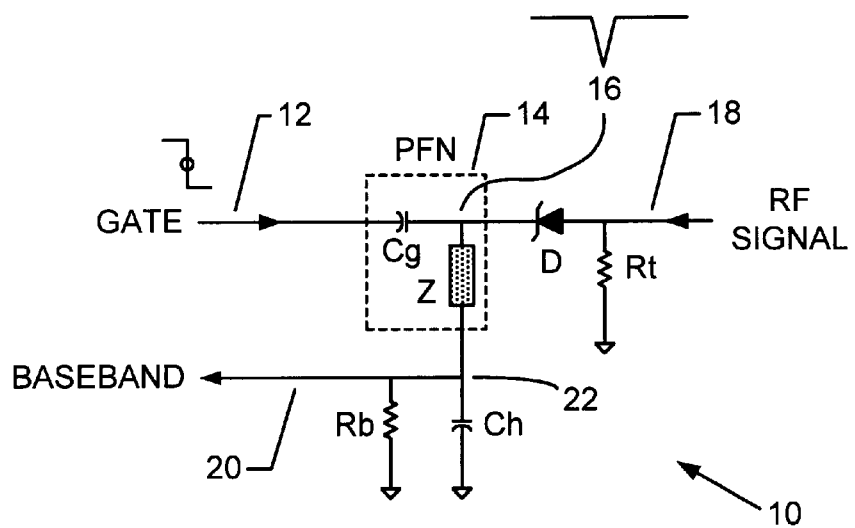
FIG. 1 is a schematic of a wideband sampler according to the present invention.

FIG. 1 is a schematic diagram of the basic elements of the wideband sampler 10. A step-waveform is provided to the gate input 12, which is connected to one terminal of a first capacitor (gating capacitor) Cg. The other terminal of Cg connects at node 16 to one terminal of an impedance element Z to make a pulse forming network (PFN) 14. The output of the PFN connects to the cathode of Schottky sampling diode D. The anode of D connects to the RF input 18. The other terminal of Z connects to one terminal of a second capacitor (hold capacitor) Ch, which has its second terminal connected to ground. Also shown is an RF termination resistor Rt ~50 Ω connected from RF input 18 (and the anode of D) to ground, which may be required to maintain a termination when D is not conducting. A bias resistor Rb ~220 KΩ shunts Ch to ground to provide a discharge path for the average current that flows through D. In the absence of Rb, diode leakage current maintains a voltage equilibrium. The baseband sampler output 20 is obtained at node 22 between Z and Ch (and Rb).

In typical operation, the gate input 12 receives a +2 to 0 V 80 ps step transition (at a 10 MHz PRF rate). Capacitor Cg in combination with Z (PFN 14) differentiates the transition into a negative 80 ps impulse, driving D into conduction for about 40 ps. Cg acquires charge due to the conduction of D, with the amount of charge scaled by the series voltage sum of the 80 ps negative impulse and the RF input voltage. After the conduction interval, charge transfers from Cg to Ch via Z. Typically, Z is an inductor, a resistor or a short transmission line that passes the charge from Cg quickly, before the next conduction cycle. Charge continues to transfer from Cg to Ch until the voltages at both ends of Z are equal. This typically occurs in a matter of nanoseconds. It is assumed that the gate input provides a DC return path for the charge flowing to and from Cg.

After multiple conduction cycles of D, a steady positive voltage builds up across Ch, reverse biasing D. This voltage buildup stabilizes when the average current through Rb equals the peak current through D times the conduction duty cycle of D, typically 0.04 ns/100 ns=0.0004. If the peak current in D is 5 mA, then the average current is 5(0.0004) mA=2 $\mu$A, and the average voltage across Rb is 220 K(2 $\mu$A)=+0.44 V.

This average voltage is the sum of the gating impulse voltage and the RF input voltage. The gating impulse voltage is held very steady by power supply regulation, so variations in voltage across Ch are due to RF input variations. Tests show that an RF sinusoidal signal with 1 mV peak-to-peak amplitude will cause greater than 0.9 mV peak-to-peak variation across Ch. This was confirmed by applying a precise 10 MHz rate to the gate input, and a 1 mV 6 GHz sinusoid to the RF input. The 6 Ghz RF was the $600^{th}$ harmonic of the gate input, offset from 6.000 GHz by 5 KHz with a synthesizer to provide a 5 KHz baseband beat frequency output signal that exhibited 0.9 mV amplitude, or 90% voltage transfer efficiency at 6 GHz.

Figure 2:
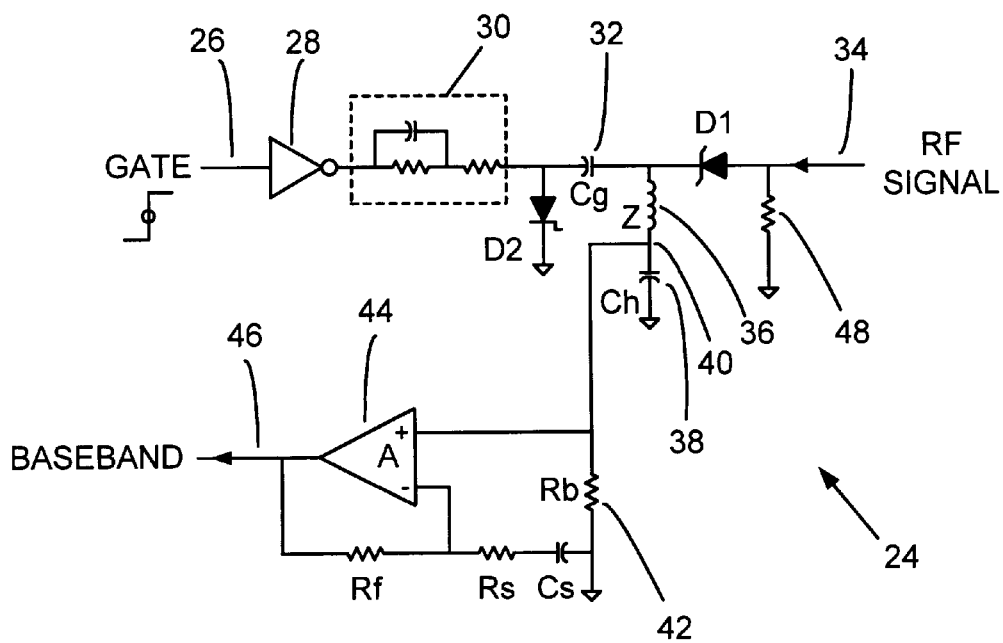
FIG. 2 is a schematic of the present invention utilizing a step recovery diode gate generator.

FIG. 2 shows a detailed schematic of a preferred embodiment of a wideband sampler 24 using a step recovery diode (SRD) D2 as the gate pulse source. In this circuit, a 0 to +5 V step is applied at gate input 26 to a 1-micron CMOS 74AC04 inverter 28 which is connected through a bias network 30 to the anode of SRD D2 whose cathode is grounded. The bias network 30 further includes parasitic series inductance (not shown) to prevent high frequency components from flowing back into the inverter 28 from the SRD. The +5 to 0 V 0.5 ns transitions from the inverter 28 snap off the SRD, resulting in a –10 V 60 ps transient which is applied to the 0.5 pF PFN capacitor 32 (equivalent to Cg of FIG. 1). Capacitor 32 is connected to the cathode of Schottky sampling diode D1 whose anode is connected to RF input 34. This transient is coupled through the 0.5 pF capacitor 32 and is shunted by the 2 nH inductor 36 (Z of FIG. 1) to form a pulse that biases D1 on for about 20 ps.

When D1 conducts, it samples the RF voltage present at input 34 for the duration of its 20 ps conduction interval. A 20 ps conduction interval results in about 20 GHz effective bandwidth. Actual measurements with a swept RF source show a DC –16.5 GHz bandwidth at the –3 db point using SMT components on a glass-epoxy circuit board. Inductor 36 is also connected through 100 pF capacitor 38 (Ch of FIG. 1) to ground. Capacitors 32, 36, Schottky diode D1, and inductor 36 operate as described above. Node 40 between inductor 36 and capacitor 38 is connected through 1 M resistor 42 (Rb of FIG. 1) to ground. Node 40 is also connected to the positive input of differential amplifier (op amp) (A) 44. The negative input of A is connected through a 1 K resistor Rs and 0.1 $\mu$F capacitor Cs in series to ground. The negative input of A is also connected in feedback through a 100 K resistor Rf to the output of A, which forms the baseband sampler output 46. RF input 34 is also connected through a 50 Ω termination resistor 48 (Rt) to ground.

Thus a wideband sample-hold circuit according to the invention is formed with a single diode in a minimum component configuration. A gate circuit comprised of a first capacitor and an impedance element forms a gate pulse, stores the sampled signal charge on the first capacitor, and transfers the charge to a second capacitor via the impedance element. The impedance element also defines the gate pulse width, in combination with the first capacitor. In a preferred mode, the first capacitor is responsive to individual gate pulses while the larger second capacitor integrates charge packets from the first capacitor due to multiple gate pulses to provide an integrated baseband output. In radar rangefinder applications, the baseband output is an equivalent time replica of the RF input. The sample-hold circuit has other applications in radar motion sensing and time domain reflectometry.

The parameters and circuit values given in the particular embodiments described herein are exemplary and illustrative and not limiting; many embodiments in accordance with the invention can be implemented with different parameters and circuit values. In the S/H circuit, the second capacitor is connected between a baseband output port and ground. Preferably, the second capacitor is substantially larger than the first for integrating charge from the first capacitor. The first capacitor is sufficiently small such that it fully charges during one conduction interval of the sampling diode. In different embodiments, the impedance element is a resistor, preferably of about 10–1 K ohms; a transmission line (whose length determines gate pulse width); or an inductor, preferably of about 1–100 nH. A bias resistor can be included to establish an average current flow in the sampling diode. A termination resistor is included for controlling the input reflection coefficient and a termination network such as an inductor can be included for RF impedance matching and spectrum limiting. A gate pulse source or generator is connected to the gate input and operates at a gate pulse repetition frequency (PRF) sufficiently high that the second capacitor substantially integrates charge from the first capacitor. The gate pulse repetition frequency (PRF) is also sufficiently low that the second capacitor substantially integrates and discharges between successive pulses. The gate pulse source can be formed with a transistor or a step recovery diode.

As shown in FIGS. 1–2 (and also FIGS. 3–4) the anode of the Schottky diode D or D1 is connected to the RF signal input and the cathode is connected to Cg. However, the Schottky diode position can be reversed. The most commonly used gate pulse generators, e.g., the SRD of FIG. 2 (or Q1 of FIGS. 3–4) produce negative pulses which are applied to the cathode of the sampling diode to make the sampling diode conducting. If a pulse generator which produces positive pulses is used, then the gate pulse would be applied to the anode to make the sampling diode conducting, so the diode would be reversed.

Figure 3:
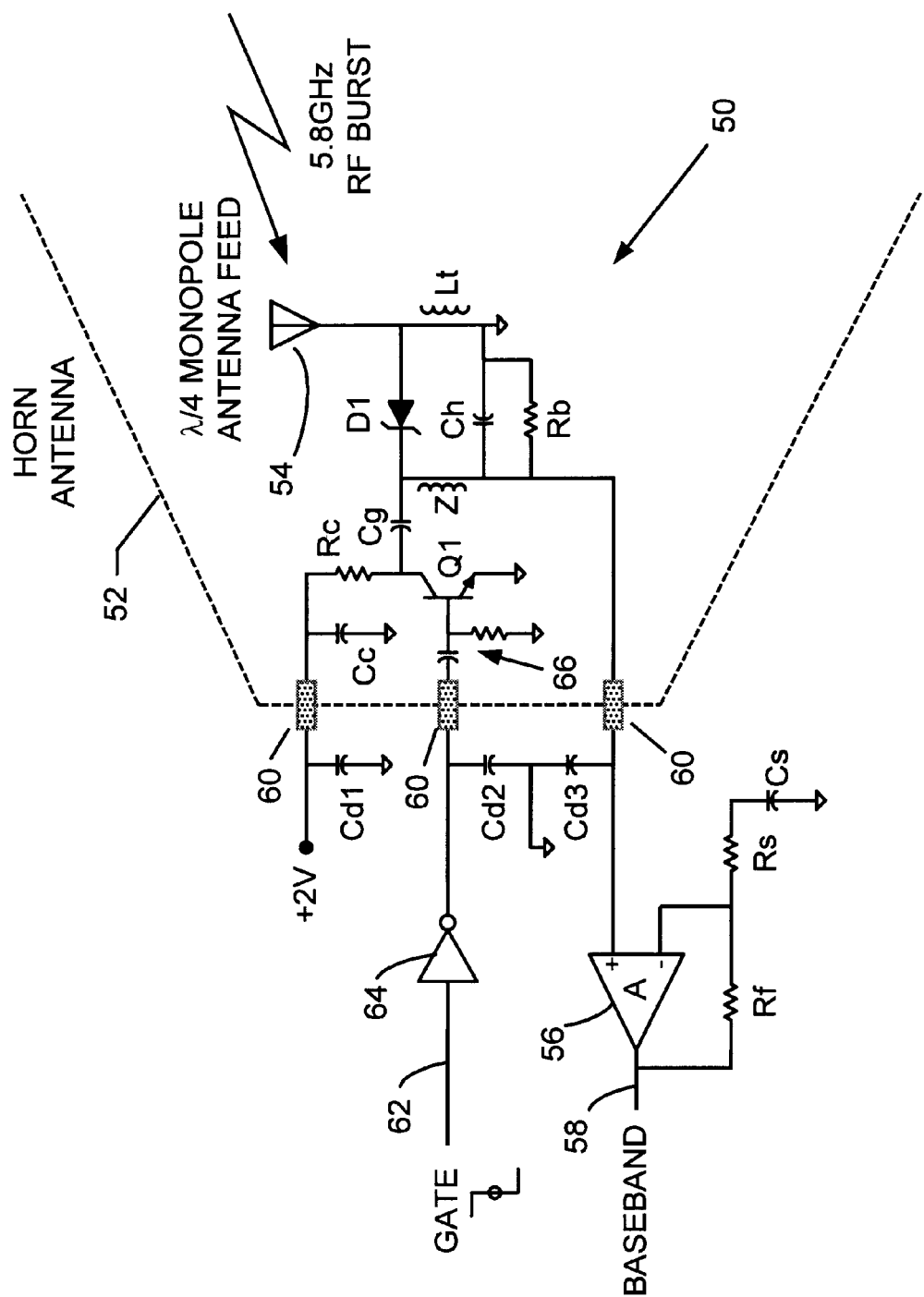
FIG. 3 discloses a 5.8 GHz receiver embodiment of the present invention.

FIG. 3 shows a schematic of the wideband sampler 50 of the present invention located at the focus of a 5.8 GHz horn antenna 52. Silicon bipolar transistor Q1, type NE68533 from Nippon Electric, is used as the gate pulse source. The elements of the sampler are similar to FIG. 2 except the 50 Ω termination resistor is replaced with an inductor Lt. An RF signal (5.8 GHz burst) is picked up by λ/4 monopole antenna feed 54 mounted in horn antenna 52 and connected to the anode of Schottky sampling diode D1. Illustrative circuit values are Cg=1 pF, Ch=1 pF, Z=3 nH, Rb=1 M, Lt=2 nH. The primary purpose of the inductor Lt is to filter out low frequency interference from cell phones and microwave ovens. In addition the horn acts as a waveguide beyond cutoff below 4 GHz. The horn and all components are mounted on a 1/16" thick glass epoxy printed circuit board using low cost SMT components. The tested bandwidth extends from 4.5–7 GHz.

A baseband amplifier (A) 56, having a gain of 40 dB and a bandwidth of about 40 KHz using op amp type TLO74 produces sampler output 58. Decoupling capacitors Cd1 (1000 pF), Cd2 (1 pF), Cd3 (2 pF) and λ/4 microstrips 60 isolate the circuitry inside the horn 52 to minimize RF leakage into the horn 52 from the rear. Gate input 62 is connected through inverter 64, microstrip 60, and RC (1 K, 5 pF) edge differentiator 66 to the base of Q1. The emitter of Q1 is connected to ground and the collector is connected to Cg and also through a 1 K resistor Rc to a +2 V voltage source with a 1000 pF capacitor Cc connected from the +2 V source to ground.

Figure 4:
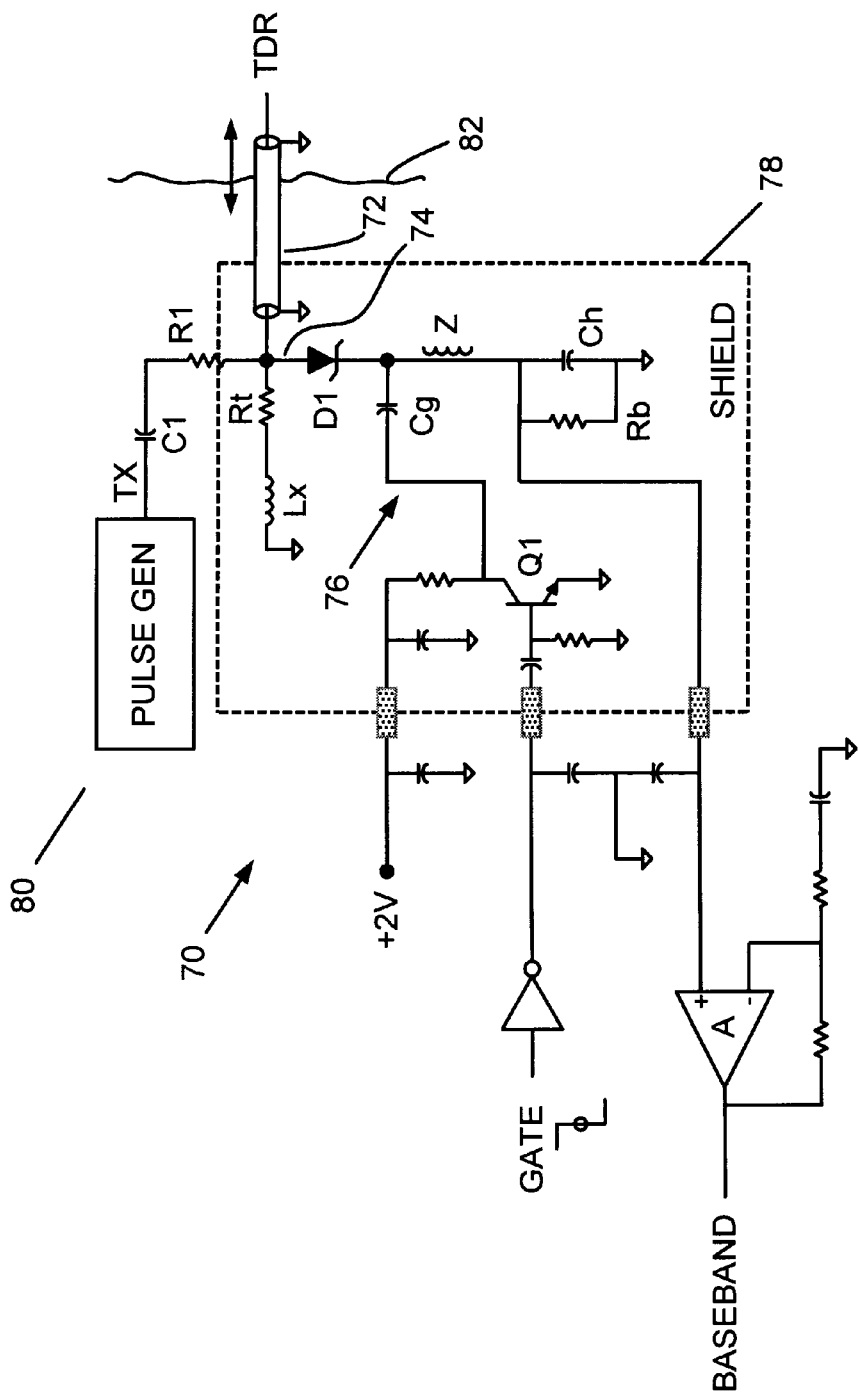
FIG. 4 depicts a time domain reflectometer implementation of the present invention.

FIG. 4 depicts a time domain reflectometer (TDR) sampling system 70 using gate, sampler and baseband amplifier circuitry similar to that shown in FIG. 3. Most of the sampler elements are contained within a shielded cavity 78. In this case, a transmit input TX from a pulse generator 80 is provided to inject a TDR pulse into the system. Typically, the pulse applied to the 1 pF capacitor C1 at TX is a +2 to 0 V 80 ps negative transition provided by a NE68533 transistor. The TX pulse is differentiated into an impulse and passed to the coaxial cable 72 through a 150 Ω resistor R1. Cable 72 extends into a material 82, e.g., a fluid. The material 82 causes a reflection of the impulse input into cable 72. The TDR cable 72 carries a reflected the pulse back where it is sampled by Schottky diode D1. A 49.9 Ω resistor Rt provides an accurate termination for reflected pulses. The 3 nH inductor Lx in series with the termination resistor Rt provides a matching but complementary impedance to cancel the loading effect of the 150 Ω resistor R1 in series with the 1 pF capacitor C1 that is connected to the termination node 74. The sampler 76 (D1, Cg, Z, Ch) loads the termination node 74 with the reverse biased diode (D1) capacitance, which can easily be 0.1 pF or less, providing for a TDR system 70 essentially free of spurious triple transit reflections. The TDR cable 72 may be a coaxial cable, or a parallel conductor cable, or a planar microstrip type structure. In another embodiment the TDR cable 72 is replaced with a single wire transmission line or Goubau line, to form an electronic dipstick for measuring fluid levels, as described in U.S. Pat. No. 5,609,059 by McEwan, which is incorporated by reference.

Changes and modifications in the specifically described embodiments can be carried out without departing from the scope of the invention which is intended to be limited only by the scope of the appended claims.

What is claimed is:

1. A wideband sample-hold (S/H) circuit comprising:
   a sampling diode having a first terminal connected to an RF input,
   a first capacitor connected from a gate input to a second terminal of the sampling diode,
   an impedance element connected at one end to a node between the first capacitor and the second terminal of the sampling diode, the first capacitor and impedance element forming a pulse forming network (PFN) to differentiate a step function gate pulse applied to the gate input to drive the sampling diode into conduction for a sampling interval to sample an RF signal applied to the RF input and to charge the first capacitor during the sampling interval, wherein said first capacitor stores sampled signal during the sampling interval,
   a second capacitor connected to the other end of the impedance element for receiving charge from the first capacitor after the sampling interval and holding a sampled RF input voltage.

2. The wideband S/H circuit of claim 1 wherein the second capacitor is connected between a baseband output port and ground.

3. The wideband S/H circuit of claim 1 wherein the second capacitor is substantially larger than the first capacitor for integrating charge from the first capacitor.

4. The wideband S/H circuit of claim 1 wherein the first capacitor has a capacitance such that it fully charges during one conduction interval of the sampling diode.

5. The wideband S/H circuit of claim 1 wherein the impedance element is a resistor.

6. The wideband S/H circuit of claim 5 wherein the resistor has a value of about 10 ohms to about 1 K ohms.

7. The wideband S/H circuit of claim 1 wherein the impedance element is a transmission line.

8. The wideband S/H circuit of claim 7 wherein the transmission line has a length which determines gate pulse width.

9. The wideband S/H circuit of claim 1 wherein the impedance element is an inductor.

10. The wideband S/H circuit of claim 9 wherein the inductor has a value of about 1 nH to about 100 nH.

11. The wideband S/H circuit of claim 1 further comprising a bias resistor connected in shunt across the second capacitor to establish an average current flow in the sampling diode.

12. The wideband S/H circuit of claim 1 further comprising a termination resistor connected from the first terminal of the sampling diode for controlling the input reflection coefficient.

13. The wideband S/H circuit of claim 1 further comprising a termination network connected from the first terminal of the sampling diode for RF impedance matching and spectrum limiting.

14. The wideband S/H circuit of claim 13 wherein the termination network comprises an inductor.

15. The wideband S/H circuit of claim 1 further comprising a gate pulse source connected to the gate input for generating step function gate pulses at a gate pulse repetition frequency (PRF).

16. The wideband S/H circuit of claim 15 wherein the gate pulse repetition frequency (PRF) is sufficiently high that the second capacitor substantially integrates charge from the first capacitor.

17. The wideband S/H circuit of claim 15 wherein the gate pulse repetition frequency (PRF) is sufficiently low that the second capacitor substantially integrates and discharges between successive pulses.

18. The wideband S/H circuit of claim 15 wherein the gate pulse source is a transistor.

19. The wideband S/H circuit of claim 15 wherein the gate pulse source is a step recovery diode.

20. The wideband S/H circuit of claim 1 wherein the first terminal of the sampling diode is the anode.

21. The wideband S/H circuit of claim 1 wherein the first terminal of the sampling diode is the cathode.

22. A sampling RF receiver comprising:
   the wideband S/H circuit of claim 1;
   an antenna connected to the RF input.

23. The sampling receiver of claim 22 wherein the antenna is a monopole antenna.

24. The sampling receiver of claim 23 further comprising a horn antenna enclosing the monopole antenna and S/H circuit with the monopole antenna located at the focus of the horn antenna.

25. A sampling time domain reflectometer (TDR) receiver comprising:
   the wideband S/H circuit of claim 1;
   a TDR transmit pulse generator connected to the RF input;
   a TDR transmission line connected to the RF input.

26. The TDR receiver of claim 25 wherein the TDR transmission line extends into a material being sampled.

27. A method for sampling an RF signal, comprising:
   passing a series of step pulses though a PFN, including a first capacitor, to produce a series of impulses;
   driving a sampling diode into conduction for a sampling interval to sample said RF signal applied to the RF input and charging the first capacitor during the sampling interval;
   transferring stored charge from the first capacitor to the second capacitor between the impulses to integrate the stored charge offer the sampling interval to produce a sampled signal.

28. The method of claim 27 wherein the step of sampling the RF signal is performed by gating said sampling diode.

29. The method of claim 27 wherein the PFN further includes an impedance element through which the step of transferring stored charge from the first to the second capacitor is performed.

30. The method of claim 27 wherein the second capacitor is substantially larger than the first capacitor for integrating charge from the first capacitor.

31. The method of claim 27 wherein the first capacitor has a capacitance such that it fully charges during each impulse.

* * * * *